Nov. 3, 1964 J. O. MORITZ 3,155,911
GATED AMPLIFIER
Filed July 27, 1962

Z FOR FORWARD-BIASED DIODE 30 IS ≈ 20Ω

INVENTOR.
JAMES O. MORITZ
BY Spencer E. Olson
ATTORNEY

United States Patent Office 3,155,911

Patented Nov. 3, 1964

3,155,911

GATED AMPLIFIER

James O. Moritz, Sunnyvale, Calif., assignor to Sylvania Electric Products, Inc., a corporation of Delaware Filed July 27, 1962, Ser. No. 212,921
4 Claims. (Cl. 328—102)

This invention relates generally to electronic circuitry for amplifying alternating current signals, and is more particularly concerned with gated amplifier circuits whose output may be switched off and on as desired.

In electronic equipment such as frequency synthesizers, radio receivers, and certain types of communications systems, it is frequently necessary to use an amplifier stage whose output may be switched off or on in response to a control signal, which may be generated locally or initiated from a remote point. For example, it may be desirable to control the radio frequency power at a given frequency in a frequency synthesizer from a remote point by digital means. That is, it is often desirable to use a remote direct current switching circuit to control the output of the amplifier.

In the usual application of a gated amplifier, it is essential that when the gate is "open" the amplifier must satisfy normal radio frequency amplifier requirements such as gain, noise level, linearity, stability, and bandwidth. However, when the gate is closed, it is important that an absolute minimum of the signal applied to the amplifier stage appears at its output circuit. The merit of the gating function is normally expressed as the ratio of the alternating current power delivered to the output load of the amplifier when the gate is open to the alternating current power delivered to the same load when the gate is closed. Hereinafter this ratio will be termed "gating power" and expressed in decibels.

It is desirable and advantageous that gated amplifiers have a low signal input impedance in order to facilitate the use of a shielded line. Such low input impedance should be held reasonably constant for either the open or closed state of the gate so as not to induce a standing wave on the drive line and thus compound the radiation problem. It also is particularly important that the input impedance does not increase significantly during the closed condition of the gate for this would increase the level of the drive signal and cause a proportional increase in signal feed-through to the output load. Further, in order that a particular amplifier design may have wide utility it is important that its gating power be relatively independent of its designed output impedance.

Prior art gated amplifiers with which applicant is familiar have gating powers of the order of 60 decibels in the high frequency band, the gating power being limited primarily by the cathode-to-plate capacitance of the amplifier tube. Although a gating power of 60 decibels is satisfactory for many applications, a higher figure is often desirable.

In light of the foregoing, it is the primary object of the present invention to provide an improved gated amplifier.

Another object of the invention is to provide a gated amplifier having a better gating power than heretofore obtainable.

Another object is to provide a gated amplifier having the foregoing properties with a minimum of components so as to have high reliability and relatively low cost.

Briefly, these objects are attained in a one-tube grounded grid amplifier the plate of which is coupled to the primary of an output transformer, and across which a diode is connected. A control switch, which may be remote from the amplifier, is connected in the cathode circuit of the tube and is operative, when closed, to connect the cathode resistor of the amplifier directly to ground so that the circuit performs as a normal grounded grid amplifier. Upon opening the control switch, the tube is biased well into the cut-off region and the diode is caused to be forward biased into conduction to shunt the alternating current plate circuit of the tube to alternating current ground. A practical circuit embodying the invention has yielded gating powers as high as 100 decibels in the high frequency band.

Other objects, features and advantages of the invention will become apparent from the following detailed description taken in conjunction with the accompanying drawings, in which.

Figure 1:
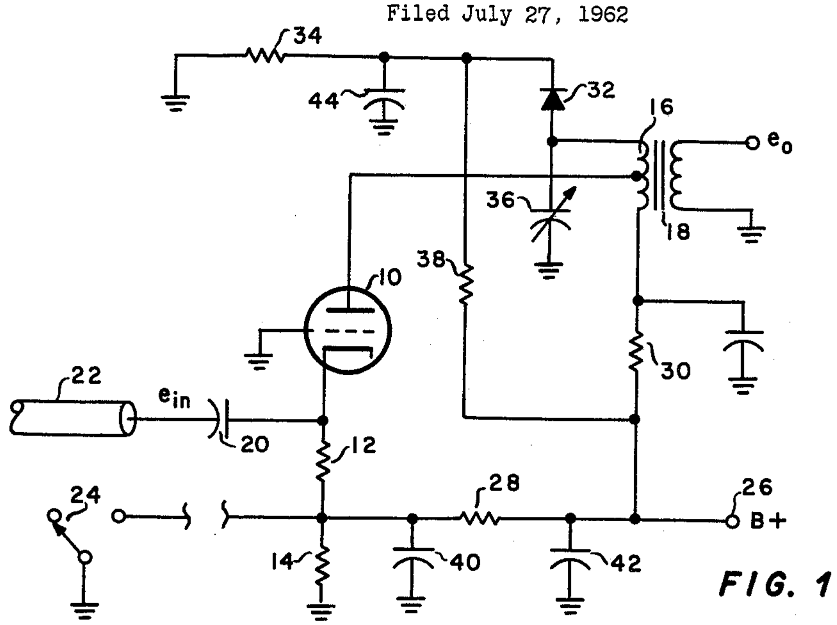
FIG. 1 is a circuit diagram of a preferred embodiment of the invention.

Referring to FIG. 1, the circuit has but one active element, a triode 10, the cathode of which is connected to ground through resistors 12 and 14 and the plate of which is connected to the center tap of the primary winding 16 of an output transformer 18. The signal to be amplified is applied to the cathode of the tube via capacitor 20, and preferably is coupled to the amplifier over a shielded cable 22. The grid of the tube is connected directly to ground. Control of the gate is afforded by a switch 24, shown schematically as a single pole-double throw switch, which may be remote from the amplifier and whose function is to connect the junction of resistors 12 and 14 to ground when the switch is closed.

The circuit is energized from a source of direct current potential, represented by terminal 26, which is applied to the junction of resistors 12 and 14 through resistor 28, and to one terminal of the primary winding of the output transformer through resistor 30. The other terminal of the primary winding has two paths to ground, one through diode 32 and resistor 34, and the other through capacitor 36. Resistor 34 together with resistor 38, connected between the junction of resistor 34 and diode 32 and the source of B+ function as a voltage divider to establish appropriate potentials at the cathode of diode 32. The terminals of resistor 28 are both bypassed to ground by capacitors 40 and 42, and the junction of resistors 34 and 38 is bypassed to ground through capacitor 44.

Figure 2:
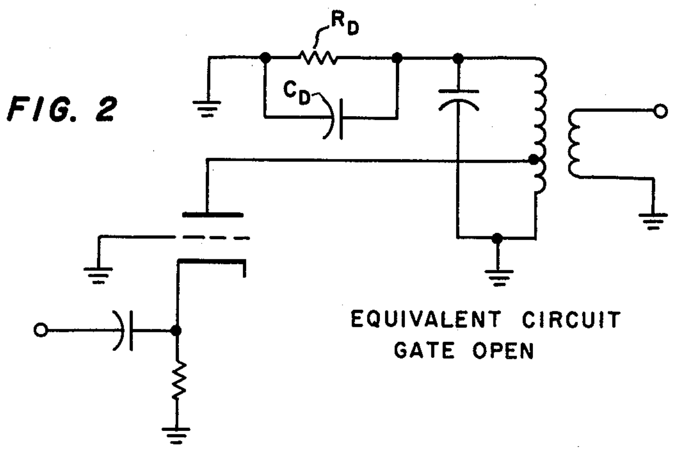
FIG. 2 is a simplified equivalent circuit diagram of the circuit of FIG. 1 when the gate is open.

Turning now to a description of the operation of the circuit, when switch 24 is closed, connecting the junction of resistors 12 and 14 to ground, the gate is open and the circuit performs as a conventional grounded grid radio frequency amplifier. Under normal operating conditions, the voltage divider consisting of resistors 34 and 38 applies a potential to the cathode of diode 32 so related to the potential applied to its anode through resistor 30 that the diode is reverse-biased and does not conduct. FIG. 2 is a simplified alternating current aquivalent circuit of the circuit of FIG. 1 with switch 24 closed. In this equivalent circuit, $R_d$ and $C_d$ are respectively the high reverse resistance and the junction capacity of the reverse-biased diode 32.

Figure 3:
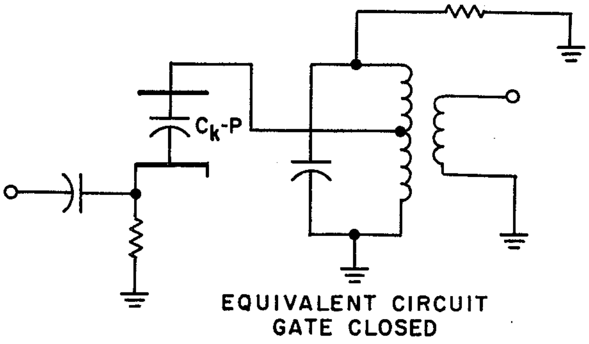
FIG. 3 is a simplified equivalent circuit diagram of the amplifier when the gate is closed.

When switch 24 is opened, the voltage divider action of resistors 14 and 28 produces a voltage at the junction of these resistors which biases tube 10 into its cut-off region. The large bypass capacitor 40 maintains a low input impedance to the amplifier which is now determined entirely by the value of resistor 12. Capacitor 40 also bypasses the control line between switch 24 and resistor 28 to alternating current ground. The values of resistors 34 and 38 are selected to maintain the voltage on the cathode of diode 32 substantially constant at a value approximately half way between B+ and the plate voltage of tube 10 in its conducting state. Consequently, as the plate current in tube 10 is turned off, the plate voltage increases to a point where it exceeds the voltage at the cathode of diode 32, at which point the diode conducts heavily and the alternating current plate circuit of tube 10 is shunted to alternating current ground through the low forward impedance of the diode and bypass capacitor 44. This alternating current short circuit is reflected to the secondary winding of output transformer 18, which is preferably tightly coupled to the primary, with the result that any residual signal power leaking through or around tube 10 when the gate is open is effectively shorted to ground. Hence, the operation of the circuit is relatively independent of the cathode-to-plate capacitance of tube 10, the total gating power of the circuit being approximately equally divided between the cut off tube and the shorted output transformer. As indicated on the simplified alternating current equivalent circuit of FIG. 3, the impedance to ground to any leakage power is only about 20 ohms.

Although the present circuit minimizes the effect of cathode-to-plate capacity of the tube, the tube nonetheless should be selected to have a low cathode-to-plate capacity, and also should have a high gain-bandwidth product, low noise, and good linearity. Diode 32 is selected for high reverse resistance so as not to adversely load the bandpass circuit and must have a low forward impedance for maximum attenuation of residual alternating current power when the gate is closed. The diode must also be capable of being reverse biased sufficiently in the open gate condition that positive signal peaks are not clipped. This large reverse bias also minimizes variable capacitance effects as a function of signal power so that bandpass jitter or similar distortions do not occur. A type 1N659 diode has been found to meet the forgoing requirements.

In order to achieve maximum obtainable gating power, a reasonable degree of care must be exercised in the construction of the circuit. Normal VHF construction techniques are applicable, and care should be taken to shield the input circuit from the output circuit. Further, it is desirable to avoid inductive coupling of the input signal since excessive coupling may occur between the input and output circuits when the gate is closed and result in a degradation of gating power.

A circuit which has operated satisfactorily in driving the deflection plates of a 6AR8 balanced sheet beam mixer tube at a frequency of 27 megacycles had the following circuit values:

Tube 10=½ 6DJ8
Transformer 18=Toroid transformer:
- Pri. at 27 mc., $Q=115$, $L=2.8$ μh.
- Sec. at 27 mc., $Q=135$, $L=7.0$ μh.
- Coefficient of coupling =0.5

Diode 32=1N659.

| | |
|---|---|
| $R_{12}$=300K ohms. | $C_{20}$=.01 μf. |
| $R_{28}$=75K ohms. | $C_{44}$=.01 μf. |
| $R_{14}$=15K ohms. | C=.01 μf. |
| $R_{34}$=20K ohms. | $C_{40}$=.01 μf. |
| $R_{38}$=8.2K ohms. | $C_{36}$=1–15 pf. |
| $R_{30}$=10K ohms. | $C_{42}$=.01 μf. |

Measurements made on this gated amplifier were as follows:

| Point of Measurement | Gate Open | Gate Closed |
|---|---|---|
| B+ (Term. 26) | +180 v. D.C. | +180 v. D.C. |
| $I_p$—Tube 10 | 12.6 ma. | 9.8 μa. |
| $E_p$—Tube 10 | +98 v. | +155 v. |
| $E_k$—Tube 10 | +2.6 v. | +31.5 v. |
| $E_k$—Diode 32 | +132 v. | +155 v. |
| $e_{in}$ at 27 mc. | 0.5 v. R.M.S. | 0.66 v. R.M.S. |
| $e_0$ at 27 mc. | 17 v. R.M.S. | .0008 v. R.M.S. (0.8 m.v.). |
| $Z_{in}$ | 150 ohms (Resistive) | 300 ohms (Resistive). |

For these measurements, the load connected across the secondary winding of the output transformer was a one megohm resistor in parallel with a ten pico-farad capacitor to simulate the deflection plates of a 6AR8 sheet beam tube. The measured gating power of this circuit was, therefore, as follows:

Gating Power=

$$20 \log \frac{e_0 \text{ gate open}}{e_0 \text{ gate closed}} = \frac{17 \text{ v. R.M.S.}}{.0008 \text{ v. R.M.S.}} = 86 \text{ db}$$

For another application, namely, to drive a 50 ohm shielded line at a frequency of two megacycles, with only minor changes in the transformer, and a change in the value of $C_{36}$ to 200 pico-farads, the circuit exhibited a gating power of 100 decibels.

From the foregoing it will be seen that applicant has provided a gated amplifier which gives a high degree of isolation between the input and output circuits when the gate is closed. Although it has been described for high frequency applications, the amplifier, with suitable modification of circuit values, is also useful at frequencies above and below the two which have been mentioned by way of example. Also, although the invention has been shown embodied in an electron tube circuit, it offers similar advantages in a transistorized version of the circuit. It is to be understood, therefore, that the above-described arrangement is merely illustrative of the application of the principles of this invention. Other arrangements may be designed by those skilled in the art without departing from the spirit and scope of the invention.

What is claimed is:

1. A gated amplifier circuit comprising, an electron tube having a cathode, a grounded control grid and an anode, means coupling said cathode to a source of signals and through a first resistor to a first source of positive potential, an output transformer having primary and secondary windings, means connecting said anode through at least a portion of said primary winding in series with a second resistor to a second source of positive potential, a diode connected in parallel with said primary winding with the anode thereof connected to one terminal of said primary winding, means connecting the cathode of said diode to a third source of positive potential, and means including a switch for changing said first source of potential from a first value at which said tube is conducting and said diode is reverse-biased to a second value at which said tube is cut off and said diode is forward-biased into conduction.

2. A gated amplifier circuit comprising, an electron tube having a cathode, a grounded control grid and an anode, an output transformer having a center-tapped primary winding and a secondary winding, means connecting said anode to the center tap of said primary winding, means connecting one terminal of said primary winding through a first resistor to a first source of positive potential, means connecting the other terminal of said primary winding to ground through two parallel paths respectively including a diode and a capacitor, the anode of said diode being connected to said other terminal of said primary winding, a first voltage divider connected between said first potential source and ground, means connecting the cathode of said diode to a point on said first voltage divider, a second voltage divider connected between said first potential source and ground, means connecting the cathode of said tube to a point on said second voltage divider, means coupling a source of singals to be amplified to said cathode, and a switch connected to said point on said second voltage divider and operative when closed to connect said point to ground.

3. A gated amplifier circuit comprising, an electron tube having a cathode, a grounded control grid and an anode, means coupling said cathode to a source of signals to be amplified and through a first resistor to a first source of positive potential, an output transformer having primary and secondary windings, a diode connected in parallel with said primary winding with the anode thereof connected to one terminal of said primary winding, means connecting the anode of said tube through a portion of said primary winding and via the other terminal thereof through a second resistor to a second source of potential more positive than said first source, means connecting the cathode of said diode to the junction of third and fourth resistors connected between said second potential source and ground, said first potential source further being defined as the junction of fifth and sixth resistors connected between said second source of potential and ground, a switch connected in parallel with said sixth resistor and operative when closed to apply suitable operating potentials to said tube to achieve amplification and to reverse-bias said diode, and operative when open to increase the positive potential at said cathode to a value at which said tube is cut off and said diode is forward-biased into conduction thereby to effectively shunt said secondary winding to ground.

4. A gated amplifier comprising, an electron tube having an anode, a cathode and a control grid, means connecting said control grid directly to ground, an output transformer having primary and secondary windings, a source of positive potential, means including a first resistor serially connected with at least a portion of said primary winding for coupling said potential source to the anode of said tube, a first voltage divider connected between said potential source and ground, a second resistor connected between the cathode of said tube and a point on said first voltage divider, a diode and a capacitor connected in series with said primary winding and to ground, a second voltage divider connected between said potential source and ground, means connecting the cathode of said diode to a point on said second voltage divider, a switch connected to said point on said first voltage divider and operative in a first position to connect said point to ground to cause normal operation of said amplifier and to cause said diode to be reverse-biased, and operative in a second position to increase the positive potential applied to the cathode of said tube to a value at which the tube is cut off and to cause said second voltage divider to forward-bias said diode to thereby shunt to ground alternating current signals in the anode circuit of said tube.

References Cited in the file of this patent

UNITED STATES PATENTS

| | | |
|---|---|---|
| 2,499,604 | Neilson | Mar. 7, 1950 |
| 2,600,120 | MacSorley | June 10, 1952 |
| 2,756,283 | Bach | July 24, 1956 |